United States Patent
Hsu et al.

(10) Patent No.: US 9,262,570 B2
(45) Date of Patent: Feb. 16, 2016

(54) LAYOUT BOUNDARY METHOD

(71) Applicant: Taiwan Semiconductor Manufacturing Co., Ltd., Hsin-Chu (TW)

(72) Inventors: Chin-Hsiung Hsu, Guanyin Township (TW); Wen-Hao Chen, Hsin-Chu (TW); Ho Che Yu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/919,037

(22) Filed: Jun. 17, 2013

(65) Prior Publication Data

US 2014/0282344 A1     Sep. 18, 2014

Related U.S. Application Data

(60) Provisional application No. 61/789,497, filed on Mar. 15, 2013.

(51) Int. Cl.
*G06F 17/50*     (2006.01)
(52) U.S. Cl.
CPC .................. *G06F 17/5072* (2013.01)

(58) Field of Classification Search
USPC ......................................... 716/123
See application file for complete search history.

(56) References Cited

U.S. PATENT DOCUMENTS

| | | | |
|---|---|---|---|
| 2001/0039642 A1* | 11/2001 | Anzai | 716/10 |
| 2005/0172252 A1* | 8/2005 | Cheng et al. | 716/10 |
| 2006/0225017 A1* | 10/2006 | Uchida | 716/12 |
| 2010/0088659 A1* | 4/2010 | Frederick et al. | 716/5 |

* cited by examiner

*Primary Examiner* — Paul Dinh
*Assistant Examiner* — Bryce Aisaka
(74) *Attorney, Agent, or Firm* — Eschweiler & Associates, LLC

(57) ABSTRACT

Some embodiments of the present disclosure relates to a method and apparatus to achieve a layout that is compatible with a multiple-patterning process. Two or more unit cells are constructed with layouts which satisfy the properties of the multiple-patterning process, and are each decomposed into two or more colors to support the multiple-patterning process. An active layout feature is merged with a dummy wire at a shared boundary between two unit cells. In the event of a short between two active layout features at the shared boundary, an automatic post-layout method can rearrange the layout features in a vicinity of the shared boundary to separate the active layout features to achieve cell functionality while satisfying the multiple-patterning properties.

18 Claims, 11 Drawing Sheets

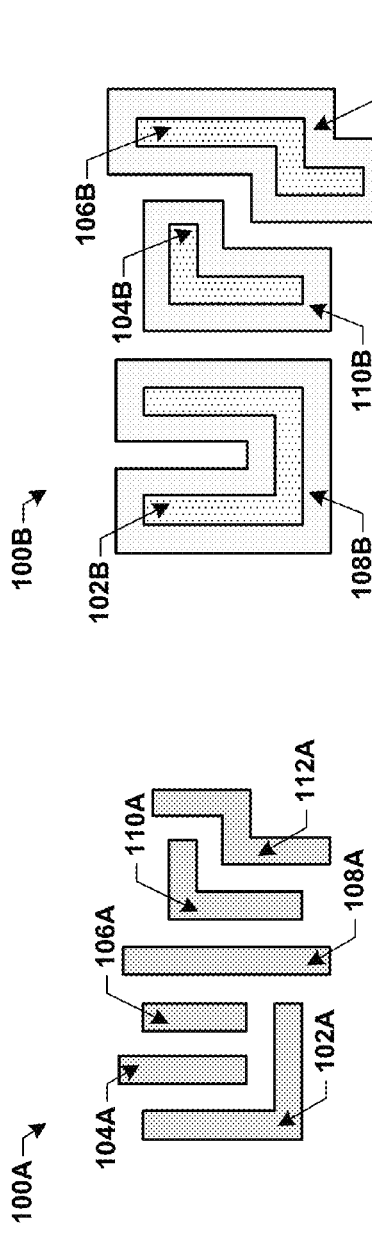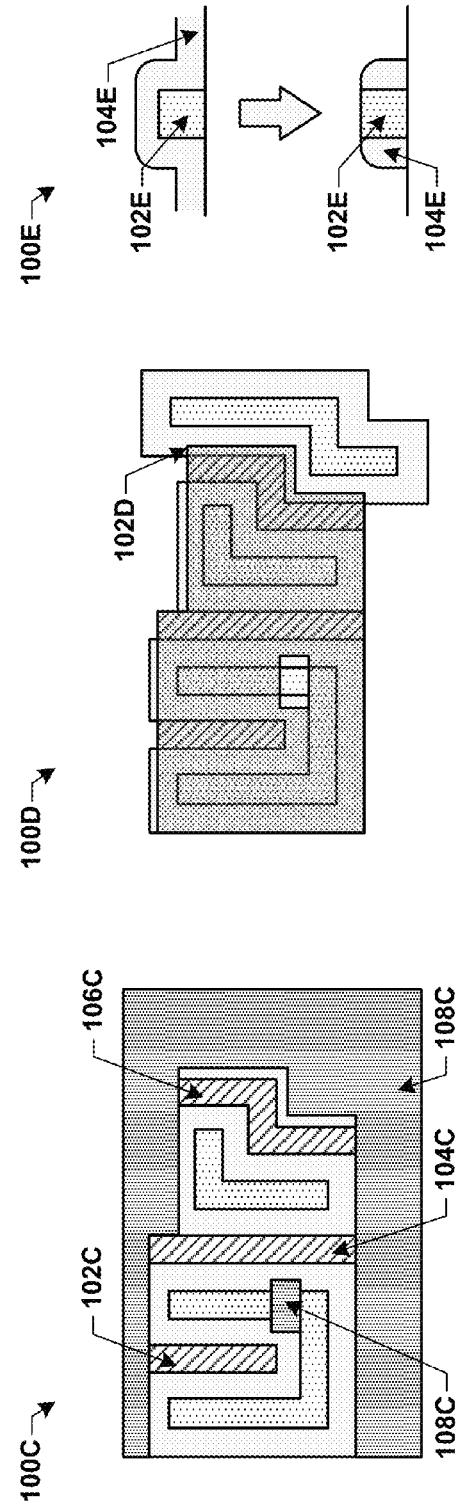

LAYOUT BOUNDARY METHOD

BACKGROUND

Moore's Law scaling dictates that the number of transistors within an integrated circuit (IC) essentially double from technology node to technology node, and consequently the chip area required to for a fixed number of transistors be cut in half for silicon cost savings and increased performance. This drives a decrease the minimum feature pitch within the IC for increased feature density. To achieve this, multiple-patterning processes may be utilized in for patterning of features formed on front-end-of-line (FEOL) layers (e.g., polysilicon gate materials) and back-end-of-line (BEOL) layers (e.g., metal wiring) in advanced technology node semiconductor manufacturing processes.

BRIEF DESCRIPTION OF THE DRAWINGS

FIGS. 1A-1E illustrate some embodiments of a self-aligned double-patterning (SADP) process.

DETAILED DESCRIPTION

Figure 2A:
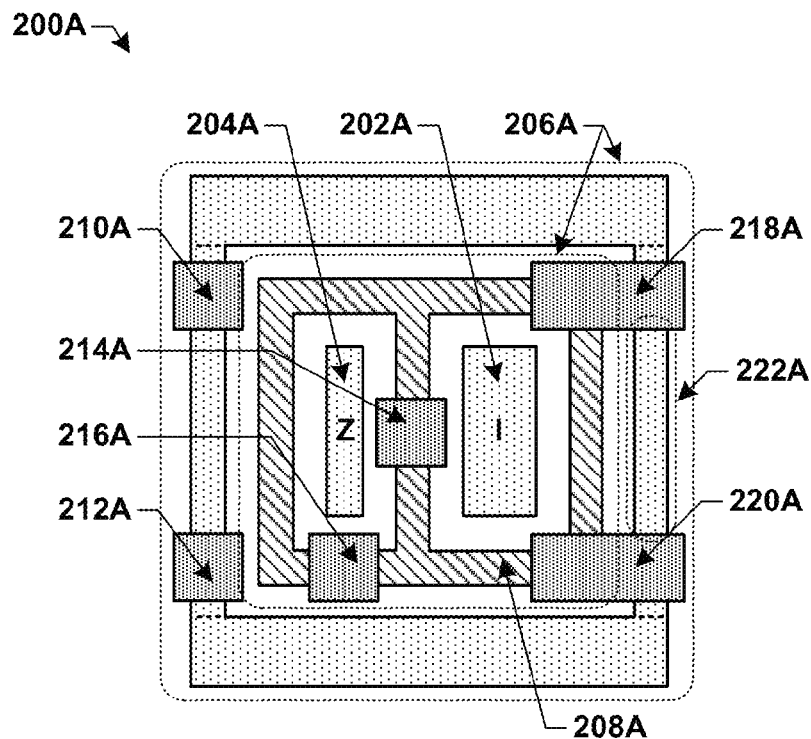
FIGS. 2A-2B illustrate some embodiments of area reduction of a cell design by merging an active layout shape with a passive border shape.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1A illustrates a target layout pattern 100A comprising first through sixth features, 102A-112A respectively, which are formed on a FEOL layer such as polysilicon or a BEOL layer such as metal. The target layout pattern 100A includes a minimum feature pitch (i.e., minimum feature size+minimum feature space) which is below a threshold that is achievable by single-exposure optical lithography. To create the target layout pattern 100A a self-aligned double-patterning (SADP) process is utilized.

FIG. 1B illustrates some embodiments of a mandrel and spacer pattern 100B formed in a self-aligned double-patterning (SADP) process, where the target layout pattern 100A has been decomposed into a mandrel pattern comprising first through third mandrel shapes, 102B-106B which form respective shapes of the first layout feature 102A, the third layout feature 106A, and the fifth layout feature 110A. Additionally, an assist mandrel 106B is disposed to aid in the formation of the sixth layout feature 112A. The first through third mandrel shapes 102B-106B are disposed on a semiconductor substrate though a first photomask exposure. A spacer formation process is then utilized to form a spacer pattern comprising first through third spacer shapes, 108B-112B respectively, about the perimeter of the first through third mandrel shapes 102B-106B. The first through third spacer shapes 108B-112B have a substantially uniform width, and are subject to variation due primarily to variability of the spacer formation process.

The spacer pattern is formed though the deposition of a spacer material 104E above the mandrel features 102E and semiconductor substrate, as illustrated in FIG. 1E. The spacer material 104E is then etched by an etch process (e.g., a dry etch) such that spacer material 104E is removed from the substrate surface and above the mandrel features 102E such that the remaining spacer material 104E resides only on the sidewalls of the mandrel features 102E.

FIG. 1C illustrates some embodiments of a first passive pattern 100C formed within the mandrel and spacer pattern 100B. The first passive pattern 100C includes first through third passive layout shapes, 102C-106C respectively, formed on regions of the semiconductor substrate which are not occupied by the mandrel and spacer pattern 100B. The first through third passive layout shapes 102C-106C form shapes of the second layout feature 104A, the fourth layout feature 108A, and the sixth layout feature 112A, respectively. A cut mask 108C is then utilized to removed excess material through a second photomask exposure which utilizes a negative tone photoresist such that exposed areas of the photoresist layer become insoluble to a photoresist developer upon being exposed. The photoresist developer is used to dissolve the unexposed portion of the photoresist, and the unexposed features on the semiconductor substrate may then be removed.

FIG. 1D illustrates some embodiments of a second passive pattern 100D which is analogous to the embodiments of the first passive pattern 100C, with the exception that a trim mask 102D is used which has an opposite polarity of the cut mask 108C. The trim mask 102D is used in conjunction with a positive tone photoresist such that exposed areas of the photoresist layer become soluble upon being exposed, and are subsequently removed.

Multiple-patterning techniques such as SADP allow for a reduced feature pitch over single-exposure techniques. Self-aligned patterning techniques such as SADP improve pattern variability over other multiple-exposure techniques such as litho-etch-litho-etch (LELE) by eliminating some mask overlay (OVL) variability. To achieve multiple-patterning, the target layout pattern 100A must be decomposed into two or more "colors." Each color corresponds to a photomask pattern which may be utilized to form the target layout pattern 100A in accordance with the embodiments of FIGS. 1A-1E. To insure the design is decomposable, layout restrictions in the form of design rules, post-layout manipulation of shapes, etc. are utilized. Among these layout restrictions for SADP as opposed to other multiple-patterning techniques is a requirement that a space between any two adjacent features of differing color have a constant value, corresponding to the substantially uniform width of the spacer pattern utilized in formation of the target layout pattern 100A. This property must be guaranteed not only at the unit cell level, but through hierarchy as an integrated chip is assembled. To achieve this, dummy features (i.e., electrically irrelevant features) are often utilized at a shared boundary of unit cells, which sacrifices chip area to achieve manufacturability.

Accordingly, the present disclosure relates to a method and apparatus to achieve a layout that is compatible with a multiple-patterning process. Two or more unit cells are constructed with layouts which satisfy the multiple-patterning properties, and are each decomposed into two or more colors to support the multiple-patterning process. An active layout feature is merged with a dummy wire at a shared boundary between two unit cells. In the event of a short between two active layout features at the shared boundary, an automatic post-layout method can rearrange the layout features in a vicinity of the shared boundary to separate the active layout features to achieve cell functionality while satisfying multiple-patterning properties. This enables patterns from both colors in the vicinity of the shared boundary for enhanced layout flexibility, a reduction in unit cell area, and a reduction in the multiple-patterning design impact.

The embodiments disclosed herein are presented in context of one or more multiple-patterning techniques. However, one of ordinary skill in the art will appreciate that the layout methodologies discussed in the context of these techniques can be generally applied to any layout that has boundary dummy wire and needs to abut with other macros in multiple patterning lithography. These multiple-patterning techniques include any layout manufactured with a multiple-exposure technique such as double, triple, and quadruple-patterning with or without multiple etch steps, directed self-assembly, a self-aligned spacer processes such as SADP or self-aligned multiple-patterning (SAMP), or other method.

FIG. 2A illustrates some embodiments of a cell design 200A, comprising a first active layout feature 202A further comprising an input pin (I) and a second active layout feature 204A further comprising an output pin (Z). The first and second active layout features 202A, 204A are formed on a first color corresponding to a first mask pattern for a multiple-patterning process. A wire ring 206A is also formed on the first color, and borders the cell design 200A to satisfy the multiple-patterning property during cell abutment. The first and second active layout features 202A, 204A, and the wire ring 206A comprise a first layout pattern of the first color, and are formed on a conducting layer (e.g., poly, metal, etc.). A second layout pattern comprising a contiguous layout feature 208A is formed on a second color corresponding to a second mask pattern for the multiple-patterning process, and is decomposed by a subset of cut mask features 210A-220A into additional active layout features by the multiple-patterning process. The first and second layout patterns may be drawn on the first and second colors explicitly, or may be drawn color-agnostic (i.e., on a single layer) and later decomposed onto the first and second colors by an automatic post-layout process within a layout manipulation tool.

Figure 2B:
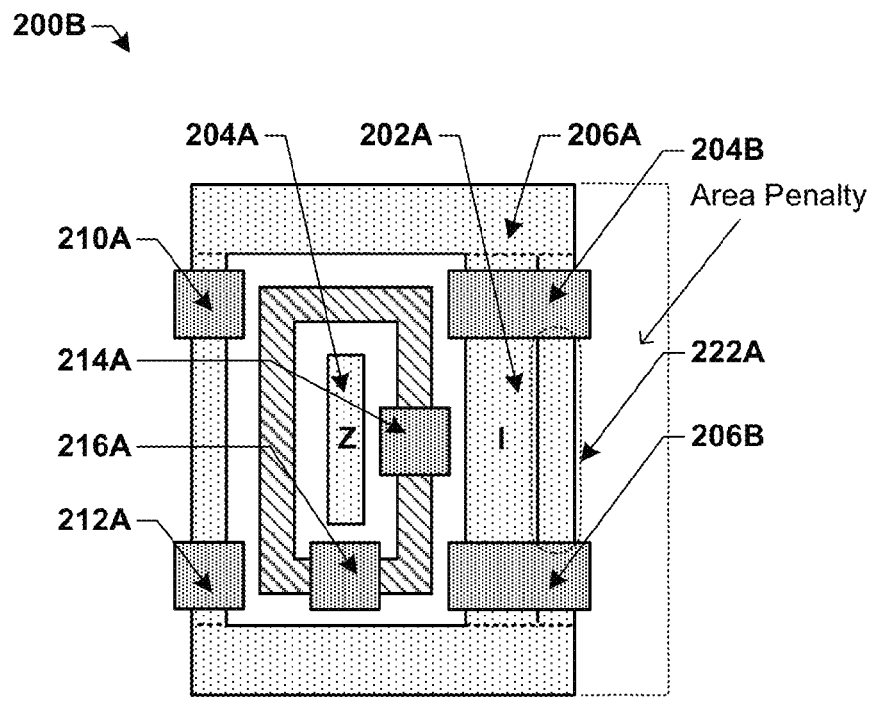

The wire ring 206A consists of a dummy wire 222A to insure electrical isolation when two or more cell designs 200A are abutted in IC assembly. While this layout method is simple and robust, the boundary style may induce extra area penalty in some cases. For the embodiments of FIG. 2A, the wire ring 206A creates border around the cell design 200A within first layout pattern (i.e., the first color). FIG. 2B illustrates a reduced cell design 200B, where the overall area of the cell design 200A is reduced by merging the first active layout feature 202A with the dummy wire 222A which is separated from the wire ring 206A by a first cut mask feature 204B and a second cut mask feature 206B.

Figure 3A:
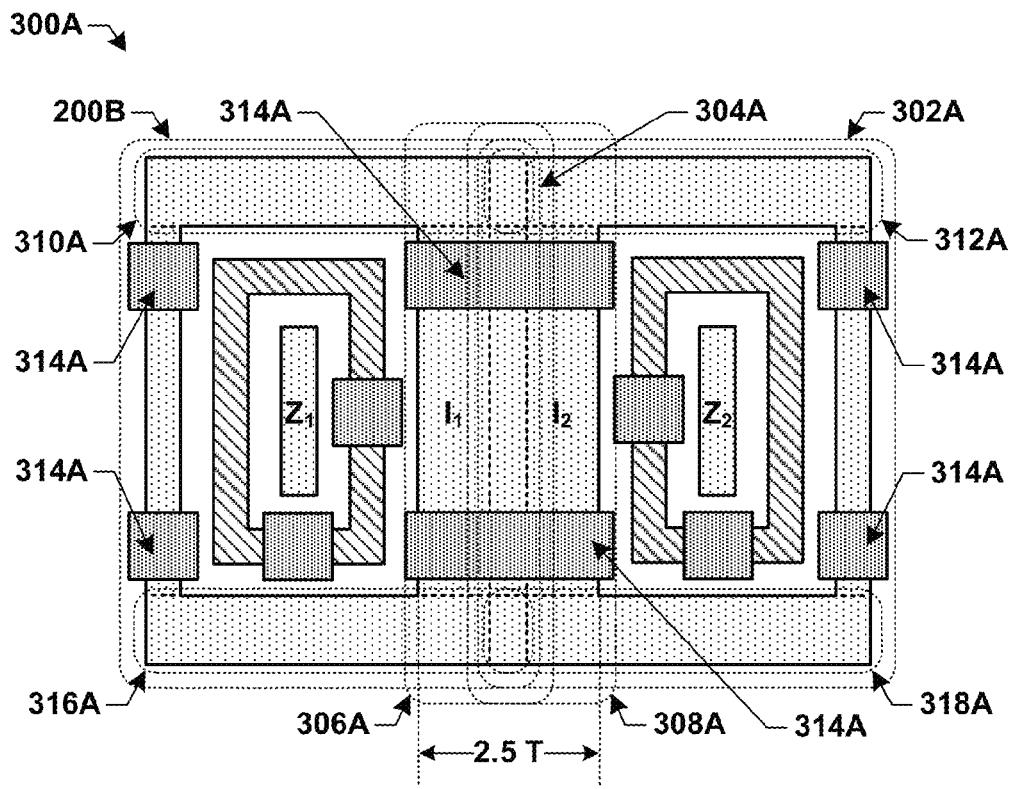
FIGS. 3A-3B illustrate some embodiments of an abutted cell structure which results in an electrical short between two active shapes within a merged border, and a reconfigurement of a shared border region to remove the short.

FIG. 3A illustrates some embodiments of an abutted cell structure 300A, where a first cell design (i.e., reduced cell design 200B) to a second cell design 302A comprising cell design 200B mirrored about a vertical axis are abutted along a shared, or merged border 304A. The merged border 304A is formed by merging a first edge 306A of a first border of the first cell design with a second edge 308A of a second border of the second cell design along a first orthogonal direction (i.e., the vertical direction). Cell abutment is common in hierarchical IC assembly and my comprise one or symmetry operations on a respective cell including mirroring about an axis, flipping, rotating, etc., for ease of routing of the BEOL metallization layers. These symmetry operations allow for power and signal wiring to be shared between two or more unit cells. For the wire ring 206A consisting of the dummy wire 222A satisfying multiple-patterning requirements, no shorting can occur. However, for the embodiments of the abutted cell structure 300A, a first input pin ($I_1$) of the first cell design contacts a second input pin ($I_2$) of the second cell design through the merged border 304A resulting in a short.

Note that for the embodiments of the abutted cell structure 300A that a third edge 310A of the first border and a fourth edge 312A of the second border are also abutted to the merged border 304A along the first orthogonal direction (i.e., vertical), where the third edge 310A and the fourth edge 312A are oriented in a second orthogonal direction (i.e., horizontal). The unioned third and fourth edges 310A, 312A are then utilized to deliver power to the first cell design and the second cell design after they are separated from the merged border 304A by cut mask features 314A. Similarly, unioned fifth and sixth edges 316A, 318A act as ground for the first cell design and the second cell design. The unioned third and fourth edges 310A, 312A and the unioned fifth and sixth edges 316A, 318A are separated from the merged border 304A by cut mask features 314A.

Figure 3B:
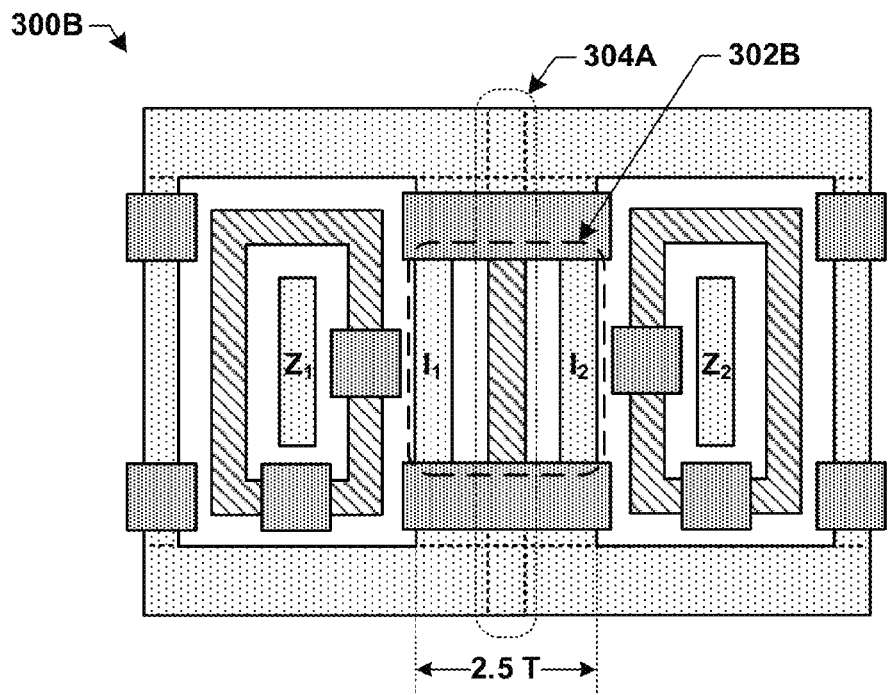

FIG. 3B illustrates some embodiments of an abutted cell structure 300B constructed in a similar manner to the embodiments of the abutted cell structure 300A. In the absence of any symmetry operation, the merged border 304A includes the first active shape of the first cell design (i.e., the first active layout feature 202A of cell design 200B). In addition, as a result placing the second cell design by mirroring the cell design 200B about the vertical axis, a second active shape of the second cell design is merged into the merged border 304A, resulting in an electrical short. The first active shape or the second active shape must be removed from the merged border 304A if an electrical short exists, or the cells will not function properly. The embodiments of the abutted cell structure 300B demonstrate a functioning geometry which includes a shared border region 302B between the first cell design and the second cell design has a width equal to 2.5 minimum pitches, or 2.5 "tracks" (2.5 T). The layout patterns within the shared border region 302B have been rearranged to configure the first active shape ($I_1$) and the second active shape ($I_2$) as separate features formed on the first color, and the merged border 304A formed on the second color within the 2.5 T area to conserve abutted cell area.

The shared border region 302B of the embodiments of the abutted cell structure 300B represents one possible solution to the shorting problem introduced in the embodiments of the abutted cell structure 300A. This solution represents a nearly optimal geometry which could be easily determined by one of ordinary skill in the art of IC layout as an equal line/space geometry within the 2.5 T area for fixed cell height. More complex layout topographies may drive less obvious solutions.

Figure 4B:
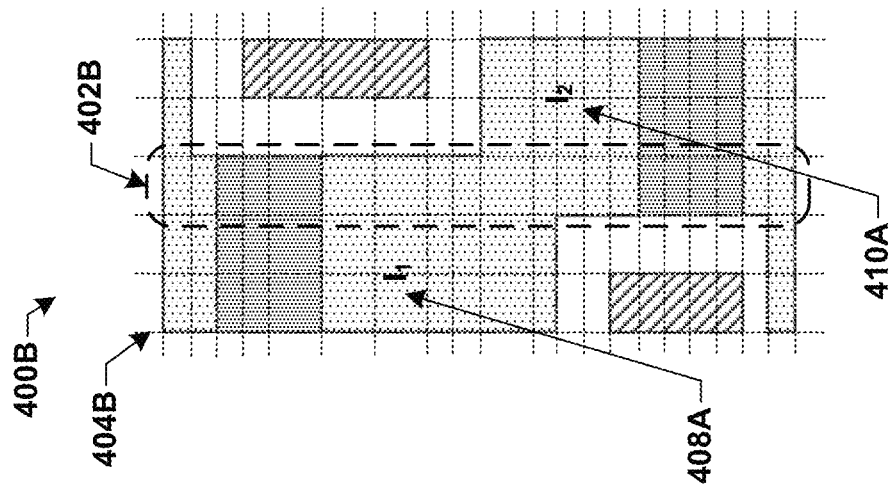
FIGS. 4A-4D illustrate some embodiments of an abutted cell structure which results in an electrical short between two active shapes within a merged border, and a reconfigurement of a shared border region by an automated layout generation tool to remove the short.
Figure 4A:
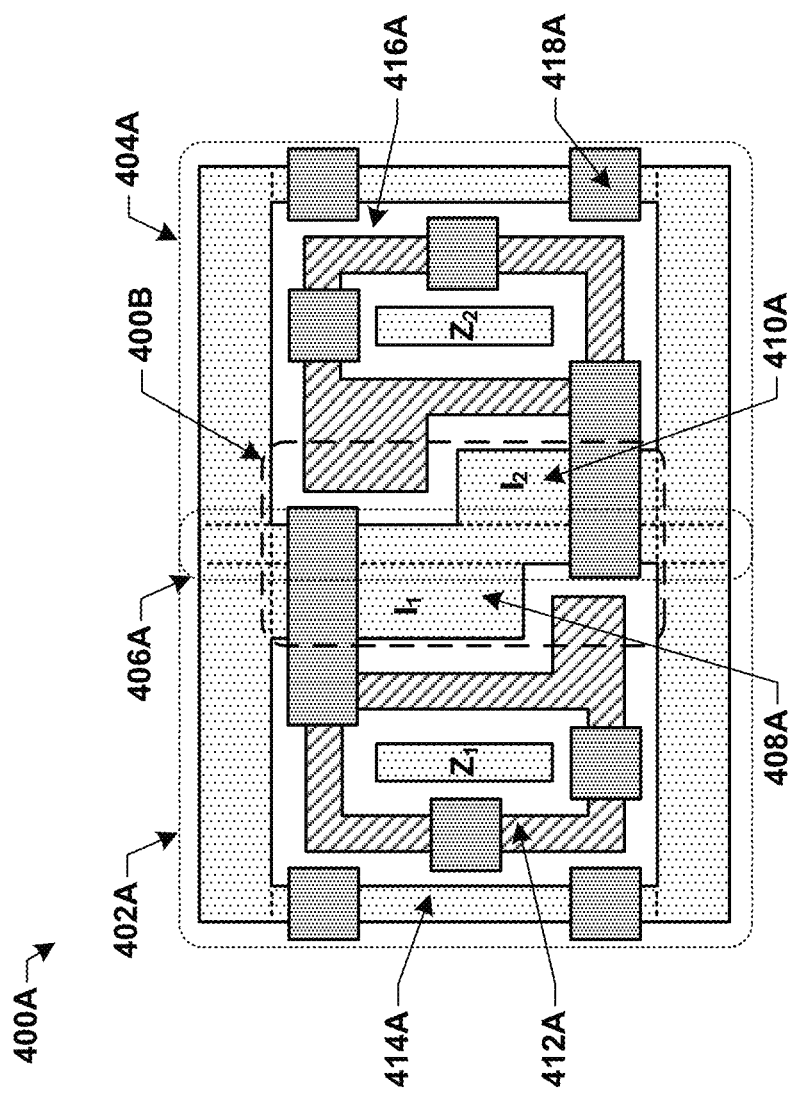

FIG. 4A illustrates some embodiments of an abutted cell structure 400A, where a first cell design 402A is abutted to second cell design 404A, by forming a merged border 406A within a merged layout pattern 400B comprising a first active shape ($I_1$) 408A of the first cell design 402A and a second active shape ($I_2$) 410A of the second cell design 404A.

The layout patterns of the first and second cell designs 402A, 404A are decomposed onto multiple masks to support the multiple-patterning process such that each mask contains a pattern of a certain "color." In some embodiments of a multiple-patterning process comprising SADP requirements, a first mask includes shapes of a first color 412A which may be utilized as mandrel shapes. A second mask is configured to produce shapes of a second color 414A in the multiple-patterning process. In the embodiments of the multiple-patterning process comprising SAMP requirements, layout features formed on the first color 412A and layout features formed on the second color 414A are separated by a uniform space which results from a spacer pattern 416A of uniform width formed on a spacer level in the SAMP process. Cut mask features 418A formed by a cut mask are utilized to further separate same-color layout features formed on the first and second colors 412A, 414A.

For the embodiments of FIGS. 4A-4D, the layout patterns formed on the first and second colors 412A, 414A are patterned on a first photoresist layer which is developed and etched to form trenches within a dielectric layer disposed over a semiconductor substrate. The trenches are filled with a conductive material (i.e., metallization layers) to form wiring to active components of an IC. The semiconductor substrate is then coated with a second photoresist layer, aligned with a cut mask comprising the cut mask features 418A, and exposed to electromagnetic radiation. The second photoresist layer includes a negative tone photoresist such that the cut mask features 418A are soluble to the developer. The patterns corresponding to the cut mask features 418A are subsequently etched through a wet or dry etching process which removes portions of the layout patterns formed on the first and second colors 412A, 414A which reside beneath the cut mask features 418A to form cut mask trenches. The cut mask trenches are then filled with a reverse material (i.e., a dielectric material), resulting in spaces between the layout patterns formed on the first and second colors 412A, 414A.

While generating the layout of the abutted cell structure 400A, one or more methods disclosed herein may be utilized to detect a short between the first active shape ($I_1$) 408A and the second active shape ($I_2$) 410A within the merged layout pattern 400B. An automated method may then be utilized within an automated layout generation tool. FIG. 4B illustrates the embodiments of the merged layout pattern 400B, where a layout grid 404B is generated within a region of the merged layout pattern 400B which coincides with orthogonal edges within the merged layout pattern 400B and adjacent layout features. The layout grid 404B is generated such that two-dimensional gridlines are orthogonal, abut edges of all layout features within the merged layout comprising a first merged border pattern 402B, and resolve to the minimum feature pitch.

Figure 4D:
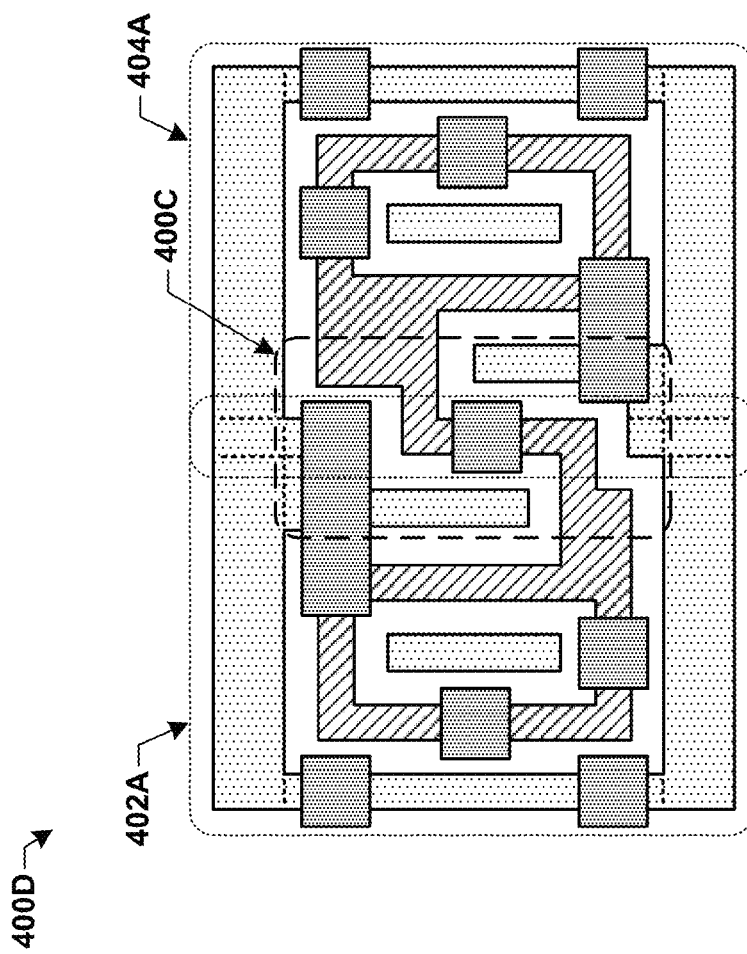
Figure 4C:
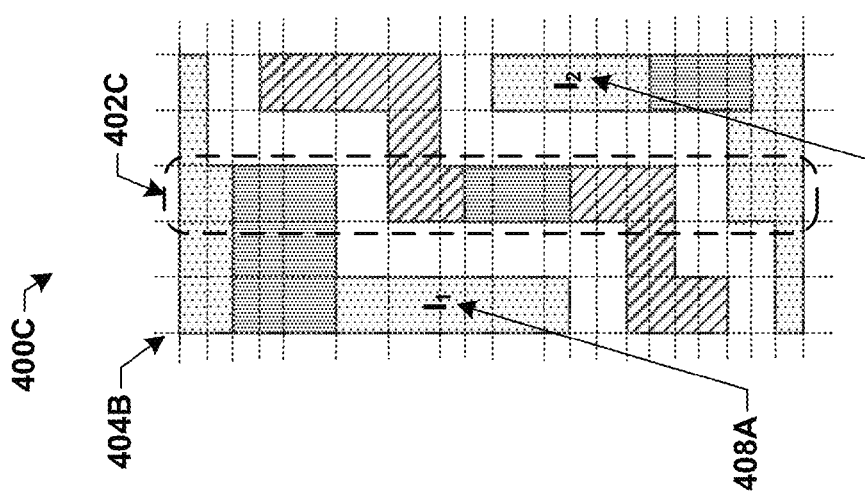

FIG. 4C illustrates the embodiments of a generated layout pattern 400C comprising a second merged border pattern 402C, and further comprising the first active shape ($I_1$) 408A and the second active shape ($I_2$) 410A which are separated from one another. The generated layout pattern 400C is generated within the layout grid 404B by random methods, simulated annealing, dynamic programming, or other appropriate method. FIG. 4D illustrates some embodiments of an abutted cell structure 400D comprising the abutted cell structure 400A, where the merged layout pattern 400B is replaced with the generated layout patterns 400C by the automated layout generation tool.

In some embodiments of hierarchical layout design, the automated layout generation tool is configured to generate one or more generated layout patterns 400C within a region merged layout pattern 400B at a first level of design hierarchy of the first and second cell designs 402A, 404A by modifying a layout of the first or second cell designs 402A, 404A directly first level of design hierarchy. In other embodiments of hierarchical layout design, the automated layout generation tool is configured to generate the one or more generated layout patterns 400C at a second level of design hierarchy which is above the first level of design hierarchy through a suppression of design shapes at the first design hierarchy by cover shapes at the second level of design hierarchy and replacement by second design shapes at the second level of design hierarchy which define the one or more generated layout patterns.

Figure 5:
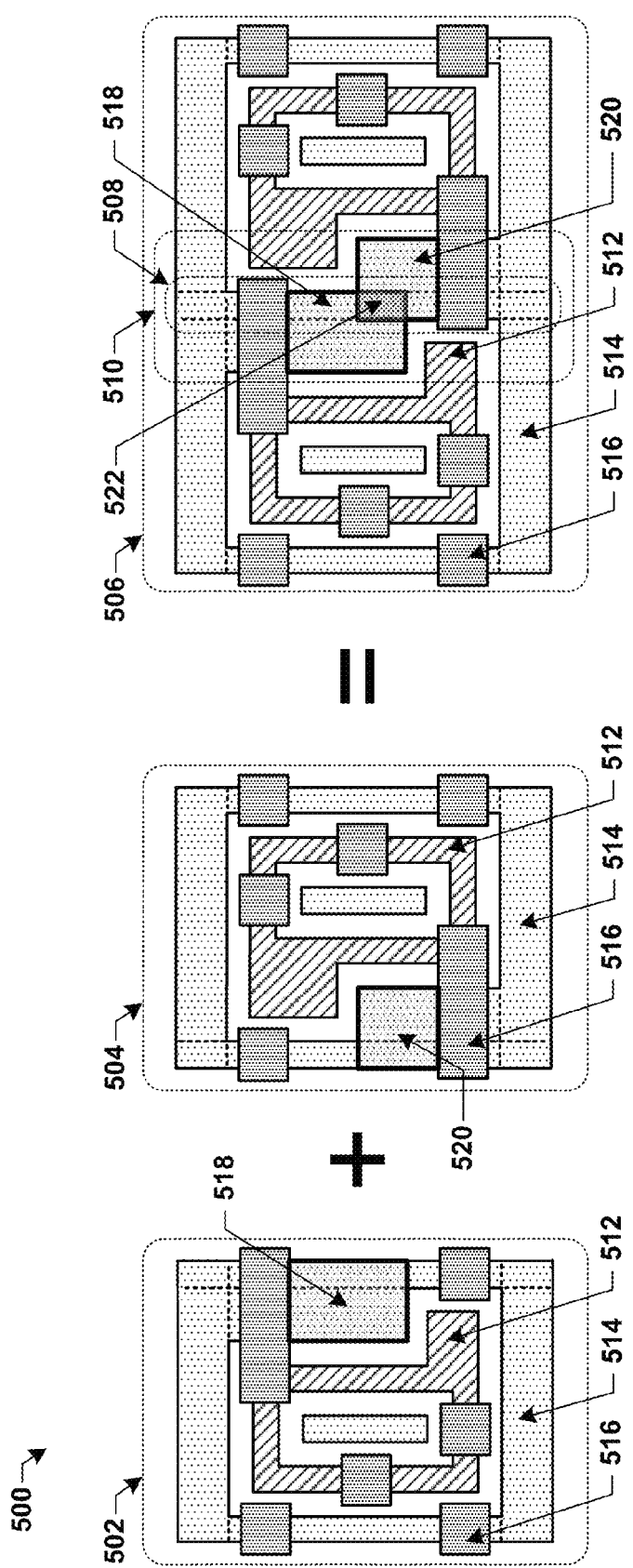
FIG. 5 illustrates some embodiments of short detection between two active shapes in an abutted cell structure.

FIG. 5 illustrates some embodiments of short detection 500 between two active shapes in an abutted cell structure 506 comprising a shared border 508 within a region 510. A first unit cell 502 is formed in a layout view and includes first layout patterns formed on a first color 512, a second color 514, and a cut mask level 516. In some embodiments, shorts formed between two active shapes within a region 510 of the shared border 508 may be detected in a layout versus schematic verification (LVS) step performed at the completion of the layout design. For the embodiments of FIG. 5, shorts may be detected though a design rule check (DRC) step, where a first active shape of a first unit cell 502 is covered with a first marker shape 518, and a second active shape of a second unit cell 504 is covered with a second marker shape 520. A DRC check for a short may then be defined as an overlap 522 of the first marker shape and the second marker shape, as illustrated in the embodiments of FIG. 5, when the first unit cell 502 is abutted with the second unit cell 504 along the shared border 508.

Note that in some embodiments of hierarchical layout design methods a blockage shape may be generated while merging an active shape comprising a pin signal wire with boundary dummy wire to keep unit cell functionality in a chip level of the design hierarchy. When the unit cell is merged, the blockage shape covers the shared border 508 or the region 510.

Figure 6:
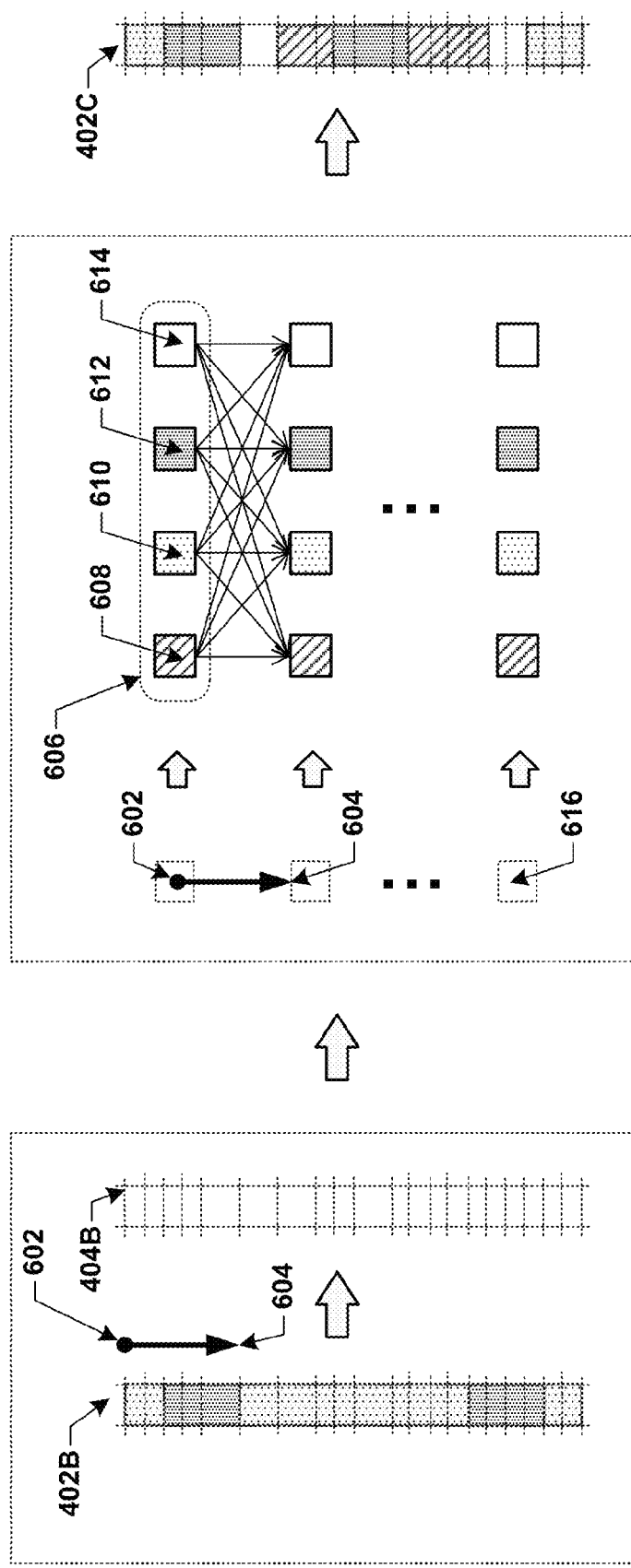
FIG. 6 illustrates some embodiments of a diagram 600 illustrating generation of one or more generated layout patterns.

FIG. 6 illustrates some embodiments of a diagram 600 illustrating generation of one or more generated layout patterns in accordance with the embodiments of FIGS. 4A-4D. From the first merged border pattern 402B an origin 602 and first propagation direction 604 are determined for a mapping from the merged layout pattern 400B to the generated layout pattern 400C once the layout grid 404B is generated.

Grid generation within the automated layout generation tool is based on boundary patterns of the merged layout pattern 400B. Grids can be uniform or non-uniform. Grids are determined by boundary-orthogonal edges from boundary patterns and boundary-adjacent patterns within the merged layout pattern 400B. For layout generation within an automated layout generation tool, every location has four choices for occupancy: a first color 608, a second color 610, a cut or trim level 612, or a spacer level 614.

In some embodiments, once a boundary condition 606 is met at the origin, the occupation of each grid location is determined randomly to enumerate though all or a subset of possible topologies of the one or more generated layout patterns. For the embodiments of FIG. 6, the boundary condition 606 results occupancy of a grid location at the origin 602 by the second color 610 to coincide with the color of the border of the unit cell.

Because enumeration through all possible patterns comprising all combinations of grid point occupancy is computationally restrictive and otherwise impractical for any real IC design, in some embodiments the one or more generated layout patterns are checked against a set of design rules enforcing geometric requirements which guarantee manufacturability. These design rules may comprise layout restrictions such as minimum dimension of a feature (e.g., minimum width or minimum area of a metal wire, etc.), or the minimum proximity (e.g., minimum space, etc.). A significant fraction of the one or more generated layout patterns will not meet these restrictions. Other limitations may be placed on grid location occupancy to prohibit complex layout topographies which may be problematic form manufacturability to further reduce the number of possible patterns.

In some embodiments, the occupation of each grid location is determined through simulated annealing of the first color 608, the second color 610, the cut or trim level 612, or the spacer level 614 at each grid location to minimize fails to the design rules. In this method, once the boundary condition 606 is determined, occupation of subsequent grid locations is determined globally for all grid locations to determine a generated layout pattern which is minimized against one or more criteria such as design rule fails or clock timing within a layout model (e.g., post-layout simulation).

In some embodiments the occupation of each grid location is determined through dynamic programming of the first color 608, the second color 610, the cut or trim level 612, or the spacer level 614 at each grid location. Once the boundary condition 606 is determined, occupancy of an adjacent grid location along the first propagation direction 604 is determined by prioritizing the design rules according to risk to manufacturability, and assigning the first color 608, the second color 610, the cut or trim level 612, or the spacer level 614 at each grid location along the first propagation direction 604 to minimize a penalty against the prioritized design rules.

Once the occupation of each grid location within the first merged border pattern 402B is determined such that the first merged border pattern 402B is "mapped" to the second merged border pattern 402C, second, third, etc. propagations direction may be chosen to continue population of the layout grid 404B. These directions may be chosen randomly, or according to a predetermined algorithm within the automated layout generation tool. Once each grid location has been occupied, a union of the first color 608, the second color 610, the cut or trim level 612, and the spacer level 614 will cover the resultant merged layout pattern 400B.

Figure 7:
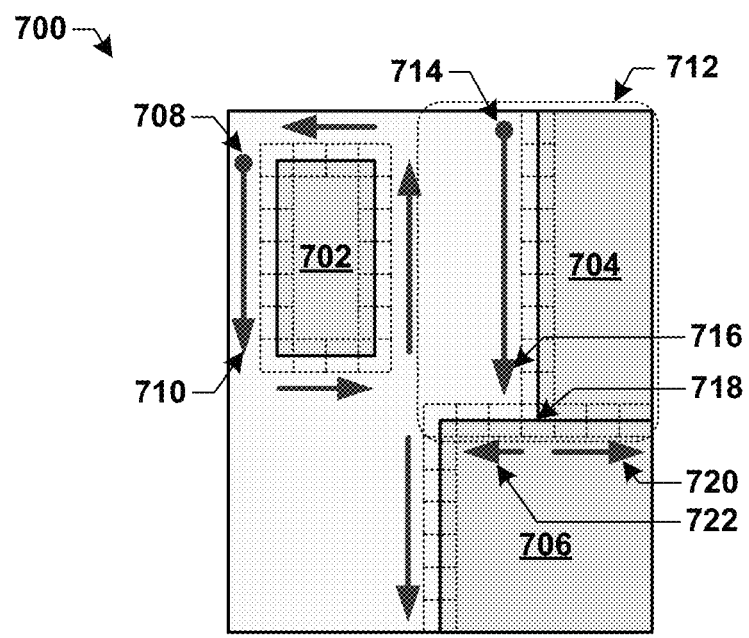
FIG. 7 illustrates some embodiments of origin and propagation direction determination between bordering layout patterns.

FIG. 7 illustrates some embodiments of origin and propagation direction determination between bordering layout patterns within an IC 700, comprising an isolated first layout pattern 702 and a second layout pattern 704 which abuts a third layout pattern 706. For different kinds of cell abutment the automated layout generation tool may define a minimum unit (e.g., minimum pitch) while merging signal wires with boundary dummy wires. Dynamic programming may then be utilized on "circle-based" and "tree-based" boundaries. For a circle-based boundary observed around the first layout pattern 702, a first origin 708 is chosen and a first propagation direction 710 follows around perimeter of the first layout pattern 702. Only two first propagation directions 710 are possible for a circle-based boundary. For a tree-based boundary 712 observed along the perimeter of the abutting second and third layout patterns 704, 706, a second origin 714 is chosen and a second propagation direction 716 follows along the edge of the second layout pattern 704. Four total propagation directions are possible for a tree-based boundary. At a point of intersection 718 of the edge of the second layout pattern 704 with an edge of the third layout pattern 706, third and fourth propagation directions 720, 722 are determined which are orthogonal to the second propagation direction 716, and anti-parallel to each other. The third propagation direction 720 terminates at an outer edge of the IC 700. The fourth propagation direction 722 continues along the perimeter the third layout pattern 706 and terminates at an outer edge of the IC 700. Along the outside edge of the IC no pattern abutment occurs. Therefore, propagation along these edges is not considered.

Figure 8:
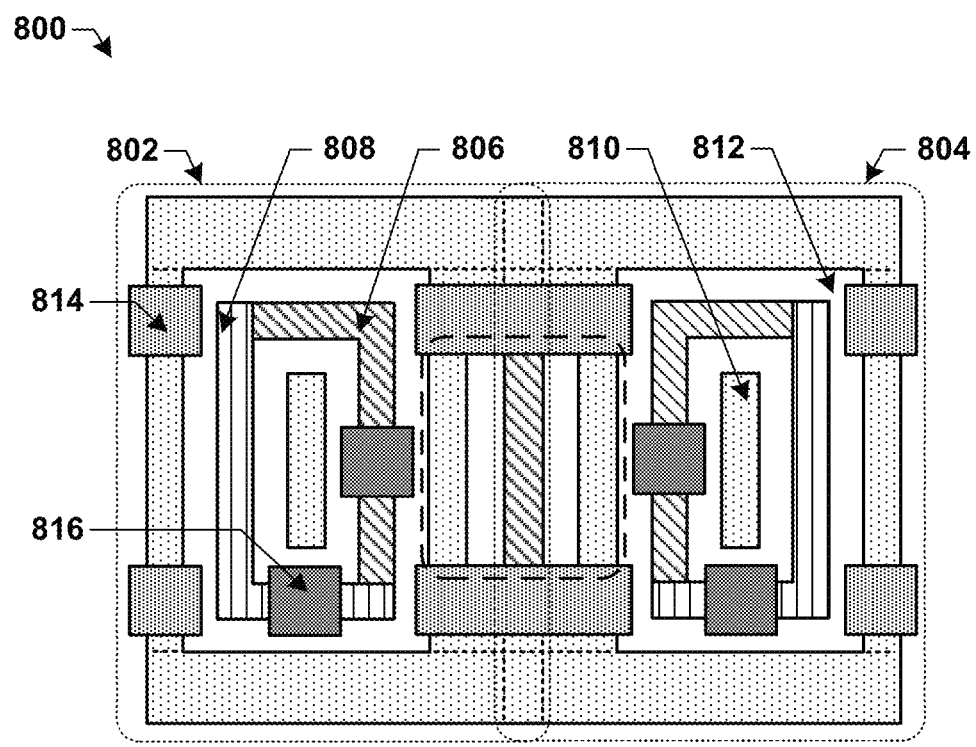
FIG. 8 illustrates some embodiments of an abutted cell structure subject to self-aligned multiple-patterning (SAMP)

FIG. 8 illustrates some embodiments of an abutted cell structure 800 subject to a multiple-patterning process, where a first cell design 802 is abutted to a second cell design 804. The abutted cell structure 800 includes a target layout pattern (i.e., all shapes) which is decomposed into a first mandrel pattern formed on a first color 806, a second mandrel formed on a second color 808, and a passive pattern formed on a third color 810, where the passive pattern is formed on regions of the semiconductor substrate which are not occupied by the first mandrel pattern, the second mandrel pattern, or a spacer pattern formed on a spacer level 812.

The first mandrel pattern is formed by a first photomask process. The second mandrel pattern is formed by a second photomask process. The spacer pattern is formed though the deposition of a spacer material about the first and second mandrel patterns in an analogous fashion to the embodiments of FIGS. 1A-1E. Because three colors are required to pattern abutted cell structure 800, two of which are active mandrel patterns, two cut mask patterns are including third and fourth cut mask patterns formed on first and second cut mask levels are required to resolve same-color spaces within the active mandrel patterns.

The embodiments of an abutted cell structure 800 support an SAMP process for three colors. Other embodiments can be extended to SAMP with an arbitrary number of cut colors. These embodiments may be extended to non-self-aligned triple patterning (e.g., LELELE). For an SAMP process, grid determination is performed such that grid lines intersect boundary-orthogonal edges of features formed on the colors, and resolves the minimum feature pitch. Determination of the origin and propagation direction follows analogously to the embodiments of FIG. 7. And, grid location occupancy is determined by the methods previously considered in the embodiments of FIG. 6, with more color and cut mask options for grid location occupancy.

Figure 9:
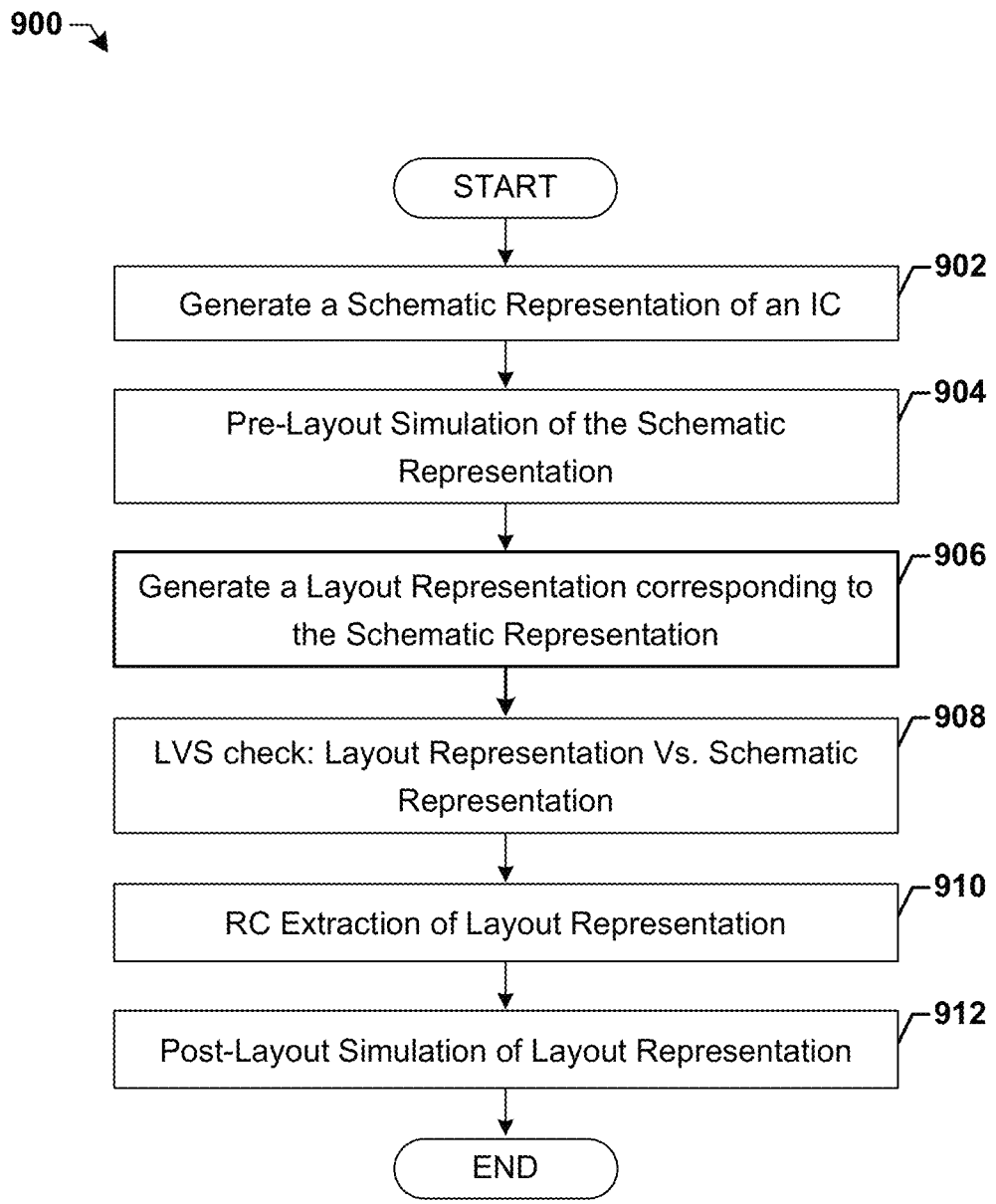
FIG. 9 illustrates an exemplary IC design flow.

FIG. 9 illustrates an exemplary integrated circuit design flow 900, comprising construction of a schematic representation of an integrated circuit (IC) at 902 in a schematic design tool such as a CADENCE VIRTUOSO or MENTOR GRAPHICS design interface, and simulation of the electrical behavior of the first schematic representation at in a pre-layout simulation step at 904 with an industry-standard circuit simulation tool such as SPICE or SPECTRE within the design interface. Upon successful completion of the pre-layout verification step at 904, a layout representation corresponding to the schematic representation is generated at 906. In some embodiments, generation of the layout representation may comprise utilization of unit cell libraries within the design interface to construct abutted layout arrays in a hierarchical design, whereupon circuit components are formed with layout features such as physical design layers (e.g., gate polysilicon, metallization planes, etc.) for manufacturing which are supported within the design interface by a technology layer file, or "techfile" provided by process design kits (PDKs). The PDKs comprise a consistent set of tools configured to create designs for an advanced technology node (e.g., Node 20) within the design interface (e.g., a device and circuit symbol library, LVS, DRC, parameterized layout cells, etc.).

An LVS step is performed at 908 to determine whether the layout representation of the IC corresponds to the schematic representation of the IC. LVS checking software recognizes the drawn layout shapes (e.g., metallization shapes, via interconnects, etc.) of the layout representation that correspond to the electrical components of the IC (e.g., wires, pins, etc.), and generates a post-layout netlist, which is compared by the LVS software such as CALIBRE, QUARTZ, or HERCULES to a pre-layout netlist generated from the schematic representation in the pre-layout verification step at 904 to verify correspondence. At 910 parasitic extraction is performed to quantify passive parameters describing the electrical behavior from a top view of the layout representation of the design. The post-layout simulation at 912 utilizes the extracted layout view in place of the schematic view to emulate actual digital and analog circuit responses within the IC. The extracted layout view is used to simulate physical circuit. The post-layout simulation step is essentially identical to the pre-layout simulation in 904, but with greater accuracy.

Figure 10:
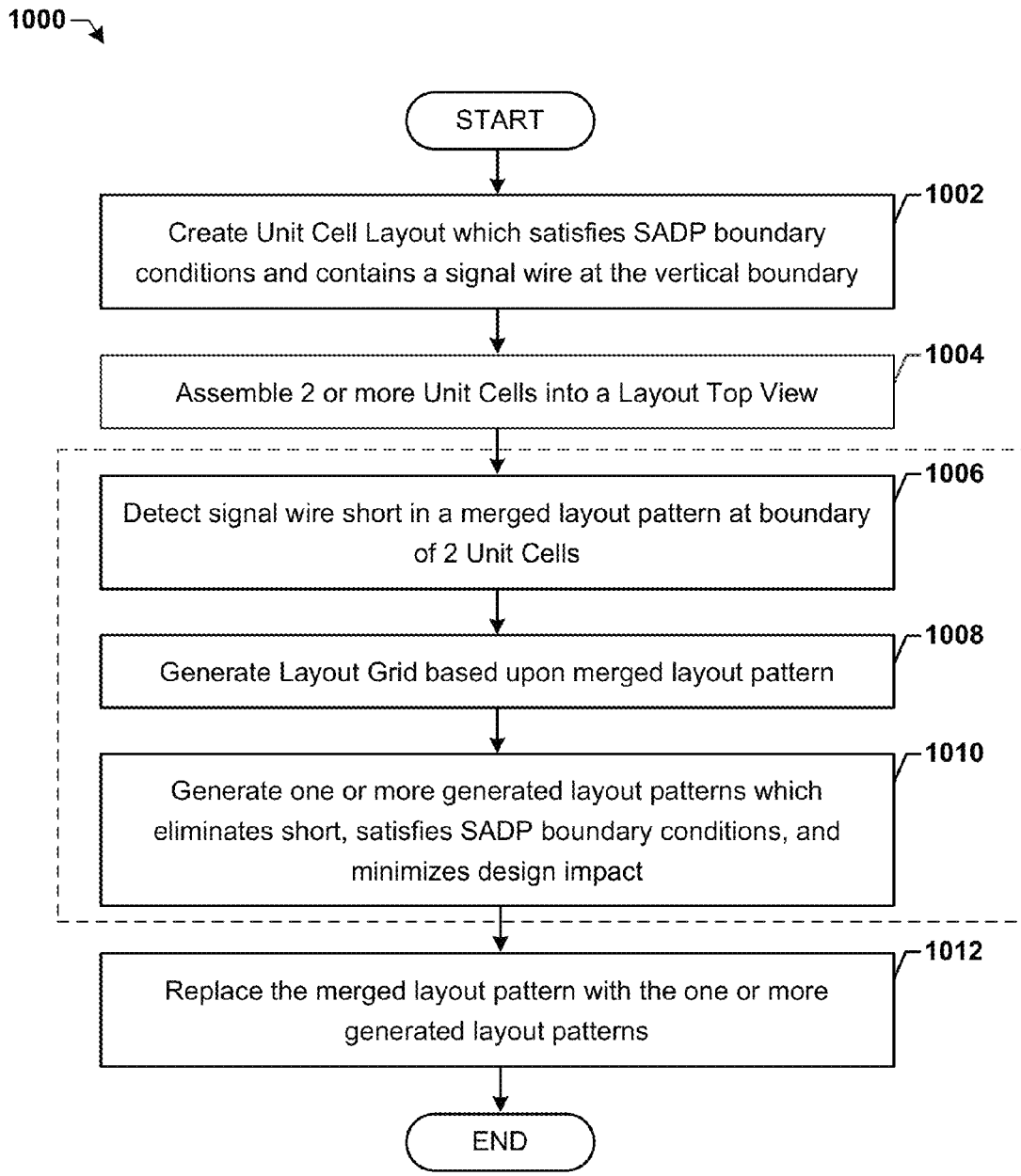
FIG. 10 illustrates some embodiments of a method to generate a layout in an automated layout generation tool.

FIG. 10 illustrates some embodiments of a method 1000 to generate a layout in an automated layout generation tool, which coincides with generation of the layout representation in 906 of the embodiments of FIG. 9. While the method 1000 is illustrated and described as a series of acts or events, it will be appreciated that the illustrated ordering of such acts or events are not to be interpreted in a limiting sense. For example, some acts may occur in different orders or concurrently with other acts or events apart from those illustrated or described herein. In addition, not all illustrated acts may be required to implement one or more aspects or embodiments of the description herein. Further, one or more of the acts depicted herein may be carried out in one or more separate acts or phases.

At 1002 a first unit cell layout is created which satisfies multiple-patterning boundary conditions and contains a first active shape (i.e., a signal wire) at a first vertical boundary of the first unit cell.

At 1004 the first unit cell is abutted to the second unit cell at a top view of the layout, where the second unit cell contains a second active shape at a second vertical boundary of the second unit cell. The first active shape shorts to the second active shape through a shared border within a merged layout pattern of the first and second unit cells. In some embodiments, the second unit cell is identical to the first unit cell, but has been subjected to one or more symmetry operations (e.g., mirroring, flipping, rotating, etc.).

At 1006 the short is detected within the merged layout pattern by a DRC check, and LVS check, or other appropriate method.

At 1008 a layout grid is generated by an automated layout generation tool within a region of the merged layout pattern which coincides with orthogonal edges within the merged layout pattern and adjacent layout features.

At 1010 one or more generated layout patterns are generated by the automated layout generation tool comprising the first active shape and the second active shape as separate features and the merged layout pattern at the shared border of the first and second unit cells.

At 1012 the merged layout pattern is replaced with the one or more generated layout patterns by the automated layout generation tool.

Figure 11:
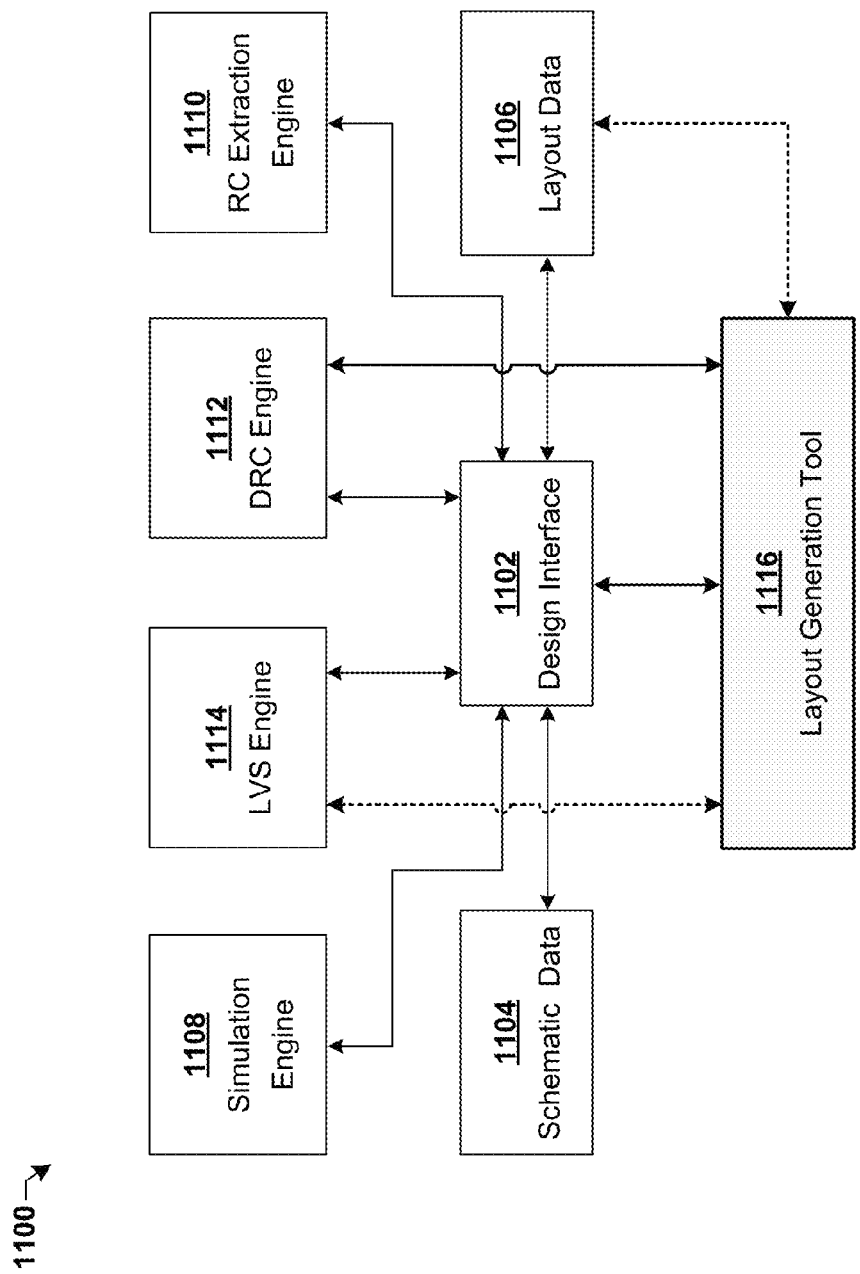
FIG. 11 illustrates some embodiments of a circuit design arrangement comprising an automated layout generation tool.

FIG. 11 illustrates some embodiments of a circuit design arrangement 1100 comprising an automated layout generation tool 1116. The circuit design arrangement 1100 also includes a design interface 1102 which is linked to schematic data 1104 of an IC and the corresponding layout data 1106 of the IC. The layout data 1106 may comprise OASIS, GDSII, or other industry-standard layout format. A simulation engine 1108 is linked to the design interface 1102 and configured to perform the pre-layout simulation and post-layout simulation of the IC. An RC extraction engine 1110 is configured to perform parasitic extraction of the layout data 1106 and provide an extracted layout view for the post-layout simulation. A DRC engine 1112 is configured to access the layout data 1106 through the design interface 1102 to perform DRC. A LVS engine 1114 is configured to access the schematic data 1104 and the layout data 1106 through the design interface 1102 to perform LVS.

The automated layout generation tool 1116 is configured to abut a first unit cell layout to a second unit cell layout along a shared border comprising a first active shape of the first unit cell and a second active shape of the second unit cell within the layout data 1106. In some embodiments, this abutment may be performed manually in the design interface 1102. The automated layout generation tool 1116 is further configured to detect a short between the first active shape and the second active shape along the shared border. In some embodiments, detection of the short performed by a DRC check, where the DRC engine 1112 is linked to the automated layout generation tool 1116 and configured to verify the layout data 1106 against a set of DRC rules comprising a first rule which requires covering of active shape within the layout data 1106 with marker shapes, and a second rule defining a violation as an overlap of active shape marker shapes. The DRC engine 1112 then communicates DRC fails to the second rule to the automated layout generation tool 1116 to define a location of the short between the first active shape and the second active shape.

The automated layout generation tool 1116 is further configured to generate a layout grid within a region of the shared border which coincides with orthogonal edges within the shared border and adjacent layout features within the region. The automated layout generation tool 1116 generates one or more generated layout patterns comprising the first active shape and the second active shape as separate features within the region and the shared border of the first and second unit cells. The one or more generated layout patterns may then be verified by the DRC engine 1112 against a set of design rules enforcing geometric requirements which guarantee manufacturability.

In some embodiments, the automated layout generation tool 1116 is configured to generate the one or more generated layout patterns within a region of the shared border of the first and second unit cells at a first level of design hierarchy of the first and second unit cell by modifying a layout of the first or second unit cell. In some embodiments, the automated layout generation tool 1116 is configured to generate the one or more generated layout patterns at a second level of design hierarchy which is above the first level of design hierarchy through a suppression of first design shapes at the first design hierarchy by cover shapes at the second level of design hierarchy and replacement by second design shapes at the second level of design hierarchy which define the one or more generated layout patterns.

It will also be appreciated that equivalent alterations or modifications may occur to one of ordinary skill in the art based upon a reading or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features or aspects of other implementations as may be desired. Furthermore, to the extent that the terms "includes", "having", "has", "with", or variants thereof are used herein; such terms are intended to be inclusive in meaning—like "comprising." Also, "exemplary" is merely meant to mean an example, rather than the best. It is also to be appreciated that features, layers or elements depicted herein are illustrated with particular dimensions or orientations relative to one another for purposes of simplicity and ease of understanding, and that the actual dimensions or orientations may differ substantially from that illustrated herein.

Therefore, the present disclosure relates to a method and apparatus to achieve a layout that is compatible with an multiple-patterning process. Two or more unit cells are constructed with layouts which satisfy the multiple-patterning properties, and are each decomposed into two or more colors to support the multiple-patterning process. An active layout feature is merged with a dummy wire at a shared boundary between two unit cells. In the event of a short between two active layout features at the shared boundary, an automatic post-layout method can rearrange the layout features in a vicinity of the shared boundary to separate the active layout features to achieve cell functionality while satisfying the multiple-patterning properties. This enables patterns from both colors in the vicinity of the shared boundary for enhanced layout flexibility, a reduction in unit cell area, and a reduction in the multiple-patterning design impact.

In some embodiments the present disclosure relates to a method to form a cell array on a substrate in a multiple-patterning process. The method comprises decomposing a cell design into a first layout pattern and a second layout pattern and creating a border around the cell design within the first layout pattern. The border is separated into active border shapes and passive border shapes by removing portions of the first layout pattern, and merging a first active shape of the first layout pattern with a passive border shape to reduce area of the cell design.

In some embodiments the present disclosure relates to a method to generate a layout in an automated layout generation tool. The method comprises detecting a short within a merged layout pattern comprising a first active shape of a first border of a first unit cell which is merged with a second active shape of a second border of a second unit cell during first and second unit cell abutment. The method further comprises generating a layout grid within a region of the merged layout pattern which coincides with orthogonal edges within the merged layout pattern and adjacent layout features. One or more generated layout patterns are generated comprising the first active shape and the second active shape as separate features and the merged layout pattern at a shared border of the first and second unit cells. The merged layout pattern is then replaced with the one or more generated layout patterns.

In some embodiments the present disclosure relates to an automated layout generation tool, configured to abut a first unit cell to a second unit cell along a shared border comprising a first active shape of the first unit cell and a second active shape of the second unit cell, and to detect a short between the first active shape and the second active shape along the shared border. The automated layout generation tool then generates a layout grid within a region of the shared border which coincides with orthogonal edges of shapes within the shared border and adjacent layout features within the region. One or more generated layout patterns are then generated by the automated layout generation tool. The one or more generated layout patterns comprise the first active shape and the second active shape as separate features within the region and the shared border of the first and second unit cells.

What is claimed is:

1. A method to generate a layout representation of a cell array, comprising:
   arranging first and second cells of the cell array next to one another, within a layout tool comprising a computer configured to generate a layout pattern of design shapes corresponding to structural features to be formed in an integrated circuit (IC), so that a first design shape disposed within the first cell abuts or partially overlaps a second design shape disposed within the second cell;
   using the layout tool comprising the computer to detect a short at a region where the first and second design shapes abut or partially overlap;
   using the layout tool comprising the computer to selectively generate a layout grid within the region based upon the detection of the short; and
   using the layout tool comprising the computer to remove at least a portion of the first design shape or the second design shape from a grid location within the layout grid to remove the short and without subsequently forming an electrical connection between the first and second design shapes;
   wherein the first and second cells are formed at a first level of design hierarchy, and wherein the portion of the first or second design shape is removed by suppression of the first or second design shape by a cover shape formed at a second level of design hierarchy, which is above the first level of design hierarchy.

2. The method of claim 1, wherein a design rule check (DRC) tool that is linked to the layout tool verifies the layout representation against a set of one or more design rules enforcing geometric requirements for the first and second design shapes which facilitate manufacturability of the layout representation.

3. The method of claim 1, further comprising:
   after the portion of the first or second design shape is removed, adding a third design shape in the region to provide electrical coupling for at least one of the first cell or the second cell without shorting the first and second design shapes.

4. The method of claim 1, wherein the first and second design shapes are formed on a shared conductive layer that is formed by a first mask.

5. The method of claim 4, further comprising:
   after the portion of the first or second design shape is removed, adding a third design shape in the region to provide electrical coupling for at least one of the first cell or the second cell, wherein the third design shape is formed by a second mask, which is distinct from the first mask.

6. The method of claim 1, wherein edges of the first and second design shapes are spaced apart from nearest neighbor edges of other design shapes, or from one another, by a constant distance, such that a space between any two nearest neighbor design shapes within the layout representation is equal to the constant distance over the entire layout representation.

7. The method of claim 1, wherein selectively generating the layout grid and removing at least the portion of the first design shape or the second design shape comprises:
generating a first set of orthogonal gridlines that coincide with edges of the first and second design shapes;
generating a second set of orthogonal gridlines that are spaced at least a minimum design rule space from the first orthogonal gridlines and from one another; and
removing the portion of the first or second design shape based on the first and second sets of orthogonal gridlines.

8. The method of claim 7, wherein the portions of the first or second design shape are removed by adding one or more cut shapes that are configured to remove the portions of the first or second design shape that the one or more cut shapes intersect.

9. The method of claim 1,
wherein the first cell comprises a first wire ring arranged along its periphery, which is connected to the first design shape;
wherein the second cell comprises a second wire ring arranged along its periphery, which is connected to the second design shape; and
wherein the first and second wire rings overlap when the first and second cells are initially arranged next to one another.

10. An automated layout generation tool, comprising:
a computer configured to generate a graphical representation of a layout of design shapes corresponding to structural features to be formed on an integrated circuit (IC);
the computer further configured to abut a first cell of the graphical representation of the layout to a second cell of the graphical representation of the layout along a shared border comprising a first design shape arranged within the first cell and a second design shape arranged within the second cell, wherein the first and second design shapes are disposed on a first level of design hierarchy;
the computer further configured to detect a short comprising a connection formed between the first design shape and the second design shape though the shared border;
the computer further configured to selectively generate a layout grid within a region of the shared border based upon the detection of the short, wherein the layout grid contains gridlines that which coincide with orthogonal edges of the first and second design shapes;
the computer further configured to remove at least a portion of the first or second design shape, based on the layout grid, to remove the short; and
the computer further configured to add a third design shape to the first level of design hierarchy within the region of the shared border based on the layout grid;
wherein the portion of the first or second design shape is removed through a suppression of the first or second design shape by a cover shape formed at a second level of design hierarchy, which is above the first level of design hierarchy.

11. The automated layout generation tool of claim 10, further comprising a design rule check (DRC) engine configured to verify the first, second, and third design shapes against a set of design rules enforcing geometric requirements for the first, second, and third design shapes, which guarantee manufacturability of the first and second cells.

12. The method of claim 10, wherein, after the short has been removed, the first and second design shapes are left isolated from one another without an electrical connection being formed there between.

13. A method to form a layout representation of a cell array within an integrated circuit (IC) layout design tool comprising a computer configured to generate a layout pattern of design shapes, comprising:
using the IC layout design tool and the computer to provide a first cell comprising a first design shape formed on a first design layer;
using the IC layout design tool and the computer to provide a second cell comprising a second design shape formed on the first design layer;
using the IC layout design tool and the computer to arrange the first and second cells so that the first and second design shapes abut or partially overlap to form an electrical connection;
using the IC layout design tool and the computer to detect the electrical connection between the first and second design shapes;
using the IC layout design tool and the computer to selectively generate a layout grid within a region of the electrical connection based upon the detection of the electrical connection; and
using the IC layout design tool and the computer to remove at least a portion of the first design shape or the second design shape from a grid location within the layout grid to break the electrical connection and without subsequently forming another electrical connection between the first and second design shapes over the region;
wherein the portion of the first or second design shape is removed by suppression of the first or second design shape by a cover shape formed at a second level of design hierarchy, which is above the first level of design hierarchy.

14. The method of claim 13, wherein detecting the electrical connection between the first and second design shapes comprises:
generating a first netlist, which comprises connections formed on the first design layer within a schematic representation of the cell array;
generating a second netlist, which comprises connections formed on the first design layer within the layout representation of the cell array; and
comparing the first and second netlist with a layout versus schematic verification (LVS) tool to detect the electrical connection between the first and second design shapes that which is present in the layout representation but not present in the schematic representation.

15. The method of claim 13, wherein detecting the electrical connection between the first and second design shapes comprises:
covering the first design shape with a first marker shape;
covering the second design shape with a second marker shape;
defining an automated layout verification step, which comprises a design rule fail that is defined as an overlap of the first marker shape and the second marker shape; and
verifying the layout representation with a design rule check (DRC) tool to detect the design rule fail within the layout representation.

16. The method of claim 13, wherein selectively generating the layout grid and removing at least the portion of the first design shape or the second design shape comprises:
generating a first set of orthogonal gridlines that coincide with edges of the first and second design shapes;
generating a second set of orthogonal gridlines that are spaced at least a minimum design rule space from the first orthogonal gridlines and from one another; and removing the portion of the first or second design shape based on the first and second sets of orthogonal gridlines.

17. The method of claim 13, further comprising adding a third design shape that is formed on the first design layer and at the second level of design hierarchy.

18. The method of claim 17, further comprising decomposing the layout representation onto first and second masks, wherein the first and second design shapes are formed by the first mask and the third design shape is formed by the second mask.

* * * * *